United States Patent [19]
Ciszek

[11] Patent Number: 5,785,769
[45] Date of Patent: Jul. 28, 1998

[54] SUBSTRATE FOR THIN SILICON SOLAR CELLS

[75] Inventor: Theodore F. Ciszek, Evergreen, Colo.

[73] Assignee: Midwest Research Institute, Kansas City, Mo.

[21] Appl. No.: 379,970

[22] Filed: Jan. 27, 1995

Related U.S. Application Data

[62] Division of Ser. No. 116,849, Sep. 7, 1993, Pat. No. 5,401,331.

[51] Int. Cl.$^6$ .................................................. H01L 31/0288
[52] U.S. Cl. ........................ 136/256; 136/258; 136/261; 148/33
[58] Field of Search .............................. 136/256, 258 PC, 136/261; 148/33

[56] References Cited

PUBLICATIONS

M. Rodot et al, "High Efficiency Thin–Film Solar Cells On Upgraded Metallurgical Grade Si Substrates", pp. 174–179 in Photovoltaic Power Generation, Klumer Academic Publishers (1988).

*Primary Examiner*—Aaron Weisstuch
*Attorney, Agent, or Firm*—Edna M. O'Connor

[57] ABSTRACT

A substrate for a photovoltaic device wherein the substrate is the base upon which photosensitive material is to be grown and the substrate comprises an alloy having boron in a range from 0.1 atomic % of the alloy to 1.3 atomic % of the alloy and the substrate has a resistivity less than $3 \times 10^{-3}$ ohm-cm.

3 Claims, 2 Drawing Sheets

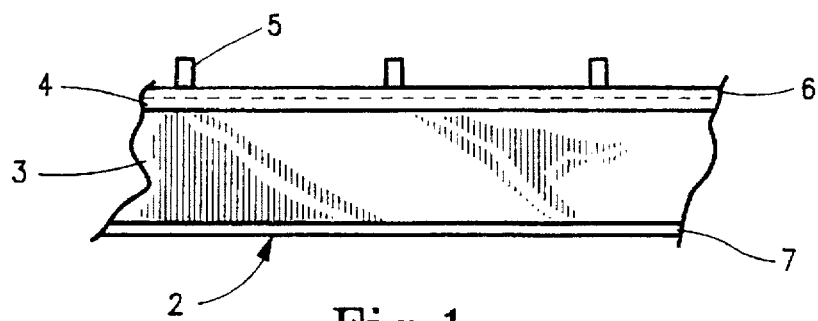
Fig.1
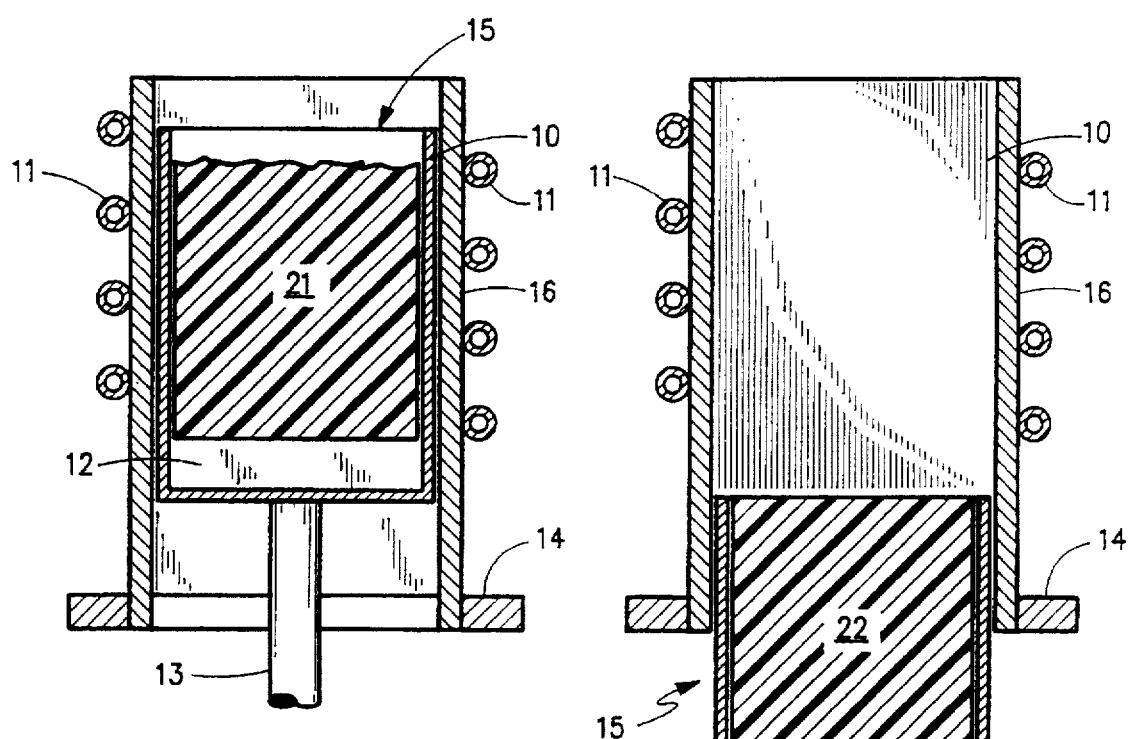
Fig.2
Fig.3

5,785,769

SUBSTRATE FOR THIN SILICON SOLAR CELLS

This application is a divisional of Ser. No. 8/116,849, "Substrate for Thin Silicon Solar Cells", filed Sep. 7, 1993, now U.S. Pat. No. 5,401,331 issued Mar. 28, 1995.

CONTRACTUAL ORIGIN OF THE INVENTION

The United States Government has rights in this invention under Contract No. DE-AC36-83CH10093 between the U.S. Department of Energy and the National Renewable Energy Laboratory, a Division of Midwest Research Institute.

BACKGROUND OF THE INVENTION

The instant invention relates to thin layered silicon photovoltaic devices. Such devices typically have a substrate on which is grown a thin layer of high purity silicon. In the instant invention the substrate is formed of an alloy of silicon and boron.

Photovoltaic devices or solar cells convert solar radiation into useable electrical energy. When solar radiation impinges on a solar cell it is absorbed by an active region of semiconductor material to generate an electric current. This is known as the photovoltaic effect.

In the past, pure silicon has frequently been used for photovoltaic devices and to form such an active region.

However, the use of such high-purity silicon is much more expensive than metallurgical grade silicon. Achieving such high-purity silicon, or solar grade silicon, suitable for a solar cell, from lower-cost metallurgical grade silicon has been difficult. The number and extent of impurities in the metallurgical-grade silicon has inhibited its use.

Several publications have been written detailing the problems and methods of reducing the impurities in metallurgical grade silicon to achieve silicon of solar grade. They include "Silicon by Sodium Reduction of Silicon Tetrafluoride", (Sanjurjo et al., J. Electrochem Soc., 128, (1981) 179–184); "Progress On The Dow Corning Process For Solar-Grade Silicon", (Hunt et al., Proceedings, 2nd European Community Photovoltaic Solar Energy Conference, Berlin, Apr. 23–26, 1979, Reidel Publishing Co., (1979) 98–105); "Improved High-Purity Arc-Furnace Silicon for Solar Cells", (Amick et al, J. Electrochem. Soc., 132, (1985) 339–345); "Solar Cells From Metallurgical Silicon Zone Melted In Polycrystalline Silicon Tubes", (Jain et al., Solar Cells, 6 (1982) 357–363); and "Efficient Solar Cells from Metallurgical-Grade Silicon", (Proceedings of the 11th Conference (1979 International) on Solid State Devices, Tokyo, 1979, Japanese Journal of Applied Physics, Volume 19 (1980) 539–544). None of the above publications mention the deliberate addition of a substantial amount of boron to metallurgical-grade silicon to achieve a low-cost, highly conductive substrate suitable for epitaxial growth of good (higher purity) thin silicon layers.

As an alternative to pure silicon solar cells, and to achieve significant cost reduction, a thin-film solar cell can be used. Such a cell includes a lower cost substrate upon which is deposited or grown a thin layer of semiconductor material. The benefits of such a thin-film cell are twofold; namely the cost savings associated with using less solar or photovoltaic grade silicon, and an improved performance due to the thinness of the silicon, since generated charge carriers have less travel distance to the cell's contacts. Such a thin-film solar cell is shown in U. S. Pat. No. 5,057,163 to Barnett et al. The substrate of the patent is a ceramic material comprising low purity silicon in the range of 20 to 90% by weight and up to 80% by weight of silicon carbide and/or glass. The addition of substantial amounts of boron to metallurgical grade silicon is not mentioned by the reference. Such a substrate as described in the patent requires, however, the addition of an active semiconductor layer, as the lattice matching required for good silicon growth is lacking.

Other low-cost substrates that have been used in the past include metals, synthetic organic resins, graphite, and other crystalline material. Such materials have proved to be acceptable through the addition of a low melting point crystalline film which is then recrystallized to form a large grain material on which the solar cell or semiconductor material can be grown. The use of substrates having a low melting point crystalline film deposited thereon is shown in U.S. Pat. No. 4,482,780 to Mitchell. Again, a problem with such substrates is that they do not provide a sufficient lattice match to have a silicon layer directly grown thereon. The addition of process steps to achieve a high-efficiency solar cell will correspond to the additional costs involved.

The subject invention avoids the problems of the prior art by providing a low cost substrate on which silicon or semiconductor material can be directly and effectively grown.

SUMMARY OF THE INVENTION

It is an object of the instant invention to provide a low cost substrate for a solar cell which has a lattice mismatch with silicon of less than 0.05%.

It is a further object of the instant invention to provide a low cost substrate having good conductivity.

It is an additional object of the invention to provide a substrate from a silicon/boron alloy which can withstand high processing temperatures.

It is a further object of the invention to form a substrate for a solar cell of metallurgical grade silicon/boron alloy on which large-grained, thin layers of higher-purity silicon will readily grow.

The invention comprises a solar cell having a low-cost substrate formed of a metallurgical grade alloy of silicon and boron. The resulting substrate has a close lattice match to pure silicon so that higher purity, thin layer silicon will readily grow thereon. The substrate is formed by alloying metallurgical grade silicon with approximately 0.1% to 1.3% by atom boron.

The invention further contemplates the method of forming a substrate of a metallurgical grade alloy of silicon and boron for a solar cell. The method comprises the steps of providing metallurgical grade silicon, providing a source of boron, adding the metallurgical grade silicon to the boron, melting the metallurgical grade silicon with the boron to form a melted material, and solidifying the melted material to form a substrate of metallurgical grade silicon and boron alloy.

To form a solar cell having a layer of photoconductive semiconductor or photosensitive material, the invention further contemplates the step of growing high purity silicon on the substrate.

BRIEF DESCRIPTION OF THE DRAWINGS

FIG. 1 shows a cross-section of a solar cell, (not to scale), made in accordance with the instant invention.

FIG. 2 shows a cross-section of the apparatus used to make the substrate of the instant invention with the alloy materials in molten form.

FIG. 3 shows a cross-section of the apparatus used to make the substrate of the instant invention with the alloy in solid form.

DESCRIPTION OF THE PREFERRED EMBODIMENT

Figure 4:
FIG. 4 shows the grain structure of a textured etched wafer cut from a substrate made in accordance with the instant invention.

The invention is directed to a substrate 3 for a solar cell 2 shown in FIG. 1. A thin layer of high purity silicon is grown on the substrate 3. The thin layer is shown generally at 4. The substrate 3 is formed of a metallurgical grade silicon and boron alloy. The solar cell has front grid metal contacts 5, a diffused p/n junction shown generally at 6, and a rear metal contact 7. A process for forming the substrate is shown specifically in FIGS. 2 and 3.

A crucible 15 to hold the materials for the alloy is formed having walls 10 and bottom 12 as shown in FIGS. 2 and 3. The crucible contents are preferably heated by an induction heating method using a radio frequency coil 11 and susceptor 16 although other forms of heating can be used to form the melt. Typically, the crucible 15 is formed of graphite or quartz, and the susceptor 16 is formed of a conductive material such as graphite or silicon carbide that can be heated by the RF or radio frequency coil to transfer its heat to the crucible contents.

A source of boron such as boric oxide ($B_2O_3$) is placed in the crucible in solid form along with metallurgical grade silicon. The relative amounts are such to achieve an alloy of 0.1 to 1.3 atomic percent boron relative to the silicon. Thus the percentage of silicon in the resulting alloy would be in a range from 99.9%–98.7%, respectively. The heating is done in an argon atmosphere to reduce any interaction with the alloy materials although the process can be performed in ambient air if a quartz crucible and silicon carbide susceptor are used.

The metallurgical grade silicon is selected from interior pieces of a solidified melt or ingot. The ingot of silicon is formed through the use of an arc furnace though other well known methods can be used. To minimize impurities the silicon ingot is cleaned in tri-chloroethane, acetone, and methanol in succession as is well known. The silicon is further etched in boiling saturated potassium hydroxide solution, and then etched three times in a mixed acid etch of acetic acid, hydrofluoric acid and nitric acid to remove slag and other exterior impurities. The interior pieces are selected from the resulting cleaned and etched ingot.

The metallurgical grade silicon metal is placed in the crucible with the boric oxide and heated to a temperature above 1420° C. to form a melt. The RF coils allow the temperature to be accurately controlled to achieve the melt. The melt material is lowered out of the RF coils at a rate to bring about solidification of the alloy material as shown in FIG. 3. Rod 13 controls the movement of the crucible 15. As rod 13 lowers the crucible bottom 12 out of the RF coils by well known mechanical means, the material 21 is cooled. The rate of movement is chosen to solidify the material as shown at 22 from the melt 21.

Although it is not intended to be limiting, the above process will be better understood through the description of a specific example as follows:

A vitreous carbon crucible was used. Into the crucible was placed 32 gm $B_2O_3$ with a water content of 170 ppm±30 ppm. The crucible was then filed with metallurgical grade silicon selected from interior pieces of a ingot The ingot from which the interior pieces were selected had been previously cleaned in tri-chlorothene (TCA), acetone, and methanol successively, etched in boiling saturated potassium hydroxide (KOH) solution, and then etched three times in an approximate 3:1:2 mixed acid etch of acetic acid, hydrofluoric acid (HF), and nitric acid ($HNO_3$). The silicon and boric oxide were melted together to form a melt and then solidified from the bottom to the top by lowering out of the RF coil at 2 mm/min to form a resultant ingot. The ingot was wafered and textured etched in a well known manner. The grain structure of a 45 mm diameter substrate wafer made from the ingot and textured etched is shown in FIG. 4. The resistivity of the substrate wafer was measured to be $3\times10^{-4}$ ohm-cm.

As this resistivity is nearly metallic, the substrate is an excellent conductor for the contact at the rear surface of the solar cell device. A lattice constant determination by X-ray diffraction was made and the value obtained for the cubic lattice material was 5.4302 Å. The JCPDS standard lattice constant for silicon is 5.43088 Å, so the lattice mismatch between silicon and the substrate is only 0.0007 Å or 0.013%.

It is understood from the above that various modifications can be made without departing from the scope of the invention. For example, the alloy could be solidified in a sheet form instead of in a crucible. Also, other well known sources of boron, such as boron powder, could be used. It is important, however, that the lattice match of the material be close to that of pure silicon to promote high purity silicon growth. It is preferable that the lattice mismatch between silicon and the conductive substrate be in a range from 0 to 0.05%. Thus the lattice constant obtained for the substrate material should be in the range from 5.4282 to 5.4330 Å. The good lattice match and the large grain size of the substrate material mean that large-grained, low-strain, thin layers of higher-purity silicon should readily grow on the substrate.

The resulting substrate is highly conductive with a resistivity of $1\times10^{-3}$ Ω-cm or less and can serve as the back contact of the solar cell or device, if desired. The substrate has a high melting temperature (>1400° C.) and will be able to withstand further processing or epitaxial layer growth temperatures of up to about 1300° C.

After the substrate material is removed from the crucible further processing can include slicing or wafering the resulting ingot on a slicing machine or other well known equipment to achieve a resultant wafer. The wafer is then textured-etched using a well-known etch to make the substrate suitable for multi-light-pass operation when a thin high purity layer is grown on it.

It is contemplated that other impurities can be added to modify the lattice constant to more closely resemble that of high purity silicon. Since boron slightly decreases the silicon lattice constant, an impurity such as gallium, which increases the silicon lattice constant, can be co-added to decrease the lattice mismatch between the substrate and high purity silicon to less than 0.01%, while at the same time further increasing the conductivity of the substrate.

The use of metallurgical grade silicon provides a substrate of considerable cost savings. Although an ingot was grown and wafered it is contemplated that other well known methods of forming substrate material can be used. They include, but are not limited to casting or solidifying the substrate material in sheets to avoid wafering costs and procedures. Also, the substrate material can be solidified from the top if desired by well known procedures.

Also, although a silicon photosensitive or photoconductive semiconductor layer is grown on the substrate in the instant invention, it is also understood that a thin film of other photosensitive or photoconductive material such as cadmium telluride can also be deposited on the improved conductive substrate if desired.

It is understood that the invention may be embodied in other specific forms without departing from the spirit or central characteristics thereof. The example and embodiment, therefore is considered to be illustrative and not restrictive and the invention is not to be limited to the details given herein but may be modified within the scope of the following claims.

I claim:

1. A substrate for a photovoltaic device, wherein said substrate is the base of said photovoltaic device upon which photosensitive material is to be grown, comprising a body material forming said substrate, said substrate comprising a top surface upon which said photsensitive material is grown, said body material comprising an alloy of metallurgical grade silicon and boron, said alloy comprising boron in a range from 0.1 atomic % of said alloy to 1.3 atomic % of said alloy, and wherein said substrate has a resistivity less than $3 \times 10^{-3}$ ohm-cm.

2. The substrate of claim 1 wherein said alloy has a lattice constant substantially matched to the lattice constant of silicon.

3. The substrate of claim 2 wherein said lattice constant is in a range from 5.4282 to 5.4330 Å.

* * * * *